United States Patent
Allison et al.

[11] Patent Number: 5,979,540
[45] Date of Patent: Nov. 9, 1999

[54] APPARATUS FOR COOLING A CARD CAGE

[75] Inventors: Johnny Hugh Allison, Plymouth; Gerald Arthur Heath, Canton; David S. Wills, Dearborn; R. David Arndt, Novi; Mark Timothy Lecznar, Woods, all of Mich.; Bruce Allen Williams, Bergich Gladbach, Germany

[73] Assignees: Ford Motor Co.; United Technologies Automotive, Inc., both of Dearborn, Mich.

[21] Appl. No.: 08/455,365

[22] Filed: May 31, 1995

[51] Int. Cl.⁶ .................................................. F28F 13/12
[52] U.S. Cl. ......................... 165/41; 165/80.3; 361/695; 361/690; 454/69; 454/127; 296/208; 123/198 E; 180/65.8; 180/65.1
[58] Field of Search .................. 165/41, 80.3; 180/65.1, 180/65.8; 123/198 E; 361/695, 690; 454/69, 127; 296/208

[56] References Cited

U.S. PATENT DOCUMENTS

| | | | |
|---|---|---|---|
| 4,065,170 | 12/1977 | Fabian et al. | 180/68.5 |
| 4,153,127 | 5/1979 | Klink et al. | 180/65.1 |
| 4,226,217 | 10/1980 | Haslbeck et al. | 123/198 E |
| 4,331,209 | 5/1982 | Bauer et al. | 180/65.1 |
| 4,364,444 | 12/1982 | Donato et al. | 180/65.1 |
| 4,562,895 | 1/1986 | Kirchweger | 123/198 E |
| 4,610,326 | 9/1986 | Kirchweger et al. | 123/198 E |
| 4,616,693 | 10/1986 | Dietzsch et al. | 165/41 |
| 4,688,148 | 8/1987 | Mallory et al. | |
| 4,858,565 | 8/1989 | King | 123/198 E |
| 4,907,645 | 3/1990 | Dumas et al. | 165/122 |
| 5,207,186 | 5/1993 | Okita | 123/198 E |
| 5,210,680 | 5/1993 | Scheibler | 165/80.3 |
| 5,263,538 | 11/1993 | Amidieu et al. | |
| 5,481,433 | 1/1996 | Carter | 165/80.3 |
| 5,505,251 | 4/1996 | Sarbach | 180/65.1 |

FOREIGN PATENT DOCUMENTS

| | | | |
|---|---|---|---|
| 1-83453 | 3/1989 | Japan | 165/41 |

Primary Examiner—John K. Ford
Attorney, Agent, or Firm—Banner & Witcoff, Ltd.

[57] ABSTRACT

An apparatus for cooling electrical components contained inside an enclosed housing, which is positioned proximate to a dashboard of a vehicle, includes an inlet pipe which receives a forced air flow and an outlet pipe which expels air from the enclosed housing. The inlet pipe receives the forced air flow either from a fan or from an air intake mechanism which supplies filtered air to an intake manifold of the vehicle engine. The air intake mechanism also maintains the temperature of the vehicle battery at a predetermined temperature by use of heated air from the engine exhaust manifold.

7 Claims, 2 Drawing Sheets

APPARATUS FOR COOLING A CARD CAGE

FIELD OF THE INVENTION

This invention relates to the field of thermal management of electrical components in a vehicle.

BACKGROUND OF THE INVENTION

Electronic components are increasingly being used in vehicles to perform and control a wide range of functions including engine control, suspension and traction control, vehicle stereo systems, electronic dashboards, and trip computers. Because excessive heat can result in damage and/or reduced life of the electronic components, thermal management of such electronic components is increasingly important as more and more vehicle functions are controlled by such components.

SUMMARY OF THE INVENTION

It is an object of the present invention to effectively control the temperature of electronic components in a vehicle when the vehicle is in operation.

In a primary aspect of the invention, electronic components are contained in an enclosed housing, termed herein as a card cage, which includes a plurality of circuit boards coupled to a backplane. The housing has an inlet opening and an outlet opening. An inlet pipe has a first end for receiving a forced air flow and a second end coupled to the inlet opening. An outlet pipe has a first end coupled to the outlet opening and a second end for expelling air from the card cage. A means for generating forced air forces air from outside of the passenger compartment of the vehicle into the inlet pipe during operation of the vehicle.

An advantage of certain preferred embodiments is that many of the vehicle electronics are located in a single housing, the temperature of which is regulated by forced air through the housing during operation of the vehicle. Access to the electronic components is enhanced by having them located in one housing and operational life of the components is increased by reducing the thermal stress, particularly heat, placed on the components.

These and other features and advantages of the present invention may be better understood by considering the following detailed description of certain preferred embodiments of the invention. In the course of this description, reference will be made to the attached drawings.

DETAILED DESCRIPTION

Figure 1:
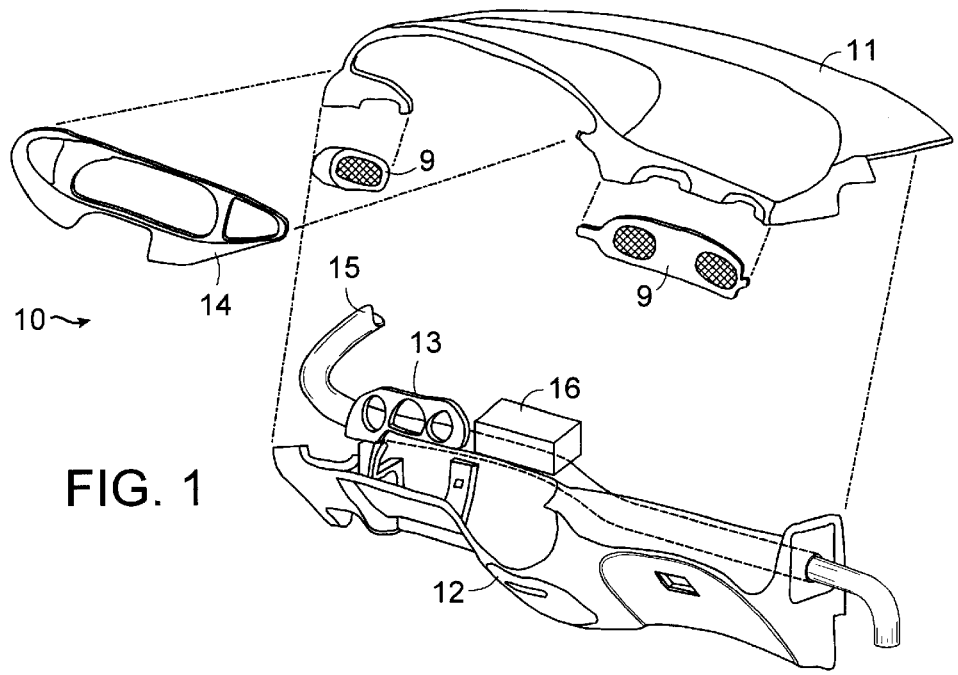
FIG. 1 is an exploded view of a preferred embodiment.

FIG. 1 of the drawings shows an exploded view of a vehicle dashboard 10 as seen from the interior of the vehicle. The dashboard 10 includes an upper portion 11, a lower portion 12, an instrument cluster 13, cluster cover 14 and vent panels 9. A cross-car beam 15 extends the width of the vehicle and functions as a portion of the vehicle frame. A card cage 16, which contains a plurality of electrical and electronic components is positioned between the dashboard 10 and a vehicle firewall (not shown).

Figure 2:
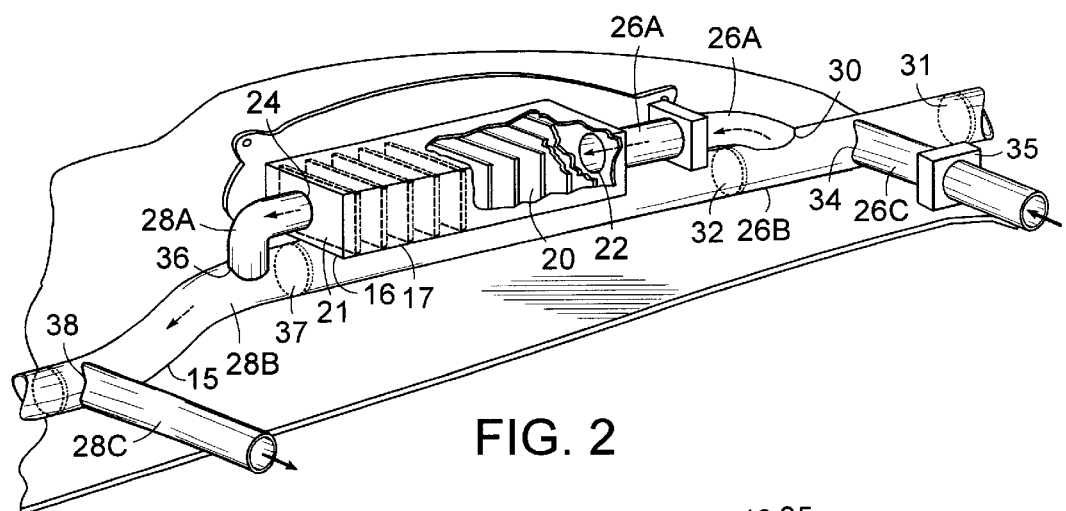
FIG. 2 is an enlarged partial cutaway view of a preferred embodiment.

FIG. 2 of the drawings shows an expanded partial cutaway view of the card cage 16 as seen looking into the vehicle windshield. The card cage 16 preferably contains a backplane connector 17 with a plurality of circuit boards 20 electrically connected to the backplane. Also contained in the card cage is a power supply (not shown) which receives electrical power from a vehicle battery (shown in FIG. 5) and transforms the power into a form useable by the electrical components. The circuit boards 20 are preferably positioned to be substantially parallel to one another. The circuitry contained in the card cage varies depending upon the capabilities of the vehicle but in certain embodiments may control the following engine and vehicle control functions: fuel injection, spark timing, anti-lock braking and traction control. The card cage 16 may also contain circuitry to control the vehicle dashboard functions, automatic heating and cooling functions, as well as additional electronic functions which may be desired. The circuit boards 20 and backplane 17 are contained in an enclosure 21, preferably constructed of plastic or similar material. The enclosure 21 includes an inlet opening 22 for receiving an air flow and an outlet opening 24 through which air in the enclosure is expelled.

An inlet tube is coupled to the inlet opening 22 and transports forced air into the card cage 16. An outlet tube is coupled to the outlet opening 24 and transports air expelled from the card cage. The inlet tube is comprised of a first portion 26A, a second portion 26B and a third portion 26C. First portion 26A is preferably a flexible tube coupled at one end to the inlet opening 22 and at a second end to an opening 30 in cross-car beam 15. Second portion 26B is preferably a portion of cross-car beam 15 which is advantageously utilized to transport air. The cross-car beam has a hollow interior with a first plug 31 and a second plug 32 for restricting air flow in the cross-car beam within the second portion 26B. Third portion 26C is preferably a flexible tube coupled at one end to an opening 34, which is within second portion 26B, in the cross-car beam, and at a second end to a source of forced air 35. The outlet tube is comprised of a first portion 28A, a second portion 28B and a third portion 28C. First portion 28A is preferably a flexible tube coupled at one end to the outlet opening 24 and at a second end to an opening 36 in cross-car beam 15. Second portion 28B is preferably a portion of cross-car beam 15 which is advantageously utilized to transport air. A third plug 37 and a fourth plug 38 restrict air flow in the cross-car beam within the second portion 28B. Third portion 28C is preferably a flexible tube coupled at one end to an opening 38, which is within second portion 28B, in the cross-car beam. Third portion 28C may be positioned to expel air either into the engine compartment or alternatively, to expel air outside of the vehicle.

Figure 3:
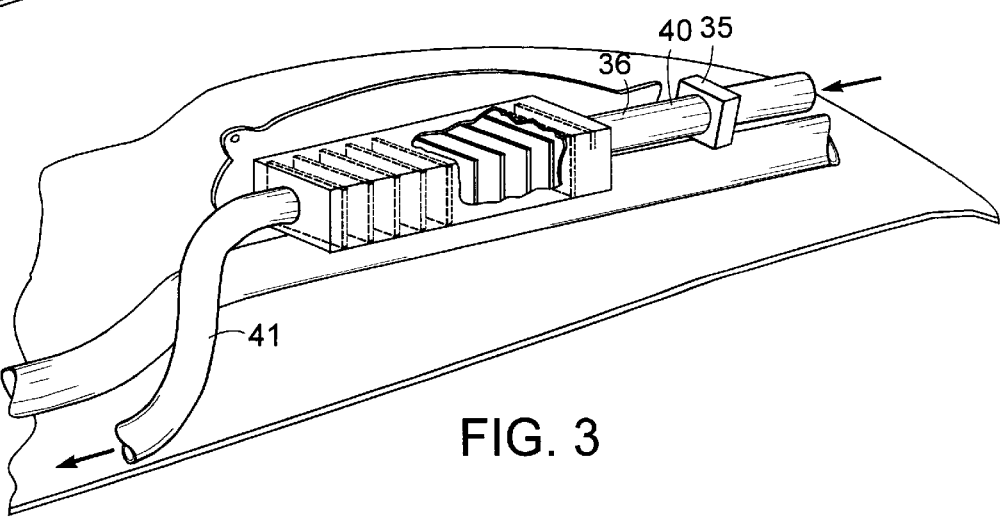
FIG. 3 is an enlarged partial cutaway view of an alternative embodiment.

FIG. 3 shows an alternative embodiment in which the inlet and outlet tubes are each comprised of single pieces of tubing 40 and 41, respectively. The outlet tube 41 may be may be positioned to expel air either into the engine compartment or alternatively, to expel air outside of the vehicle.

Figure 4:
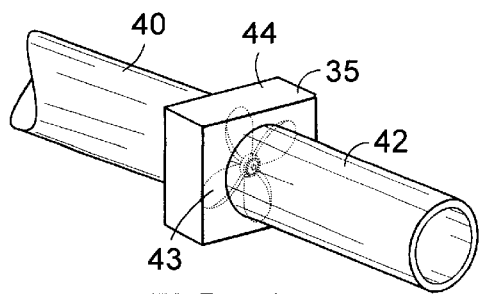
FIG. 4 is an enlarged view of a portion of a preferred embodiment.

The forced air entering the inlet tube in the embodiments shown in FIGS. 2 or 3 may be generated by means of a conventional electrically powered fan 43 as seen in FIG. 4. The fan is preferably thermostatically controlled and operates only during engine operation, to force air into the inlet pipe. A filter 44 which is downstream of the fan, filters the air entering the inlet pipe 40. The fan preferably receives air from outside of the engine compartment via an air inlet pipe 42. Alternatively, the forced air may be generated by utilizing suction generated from the engine air intake system as shown in FIG. 5.

Figure 5:
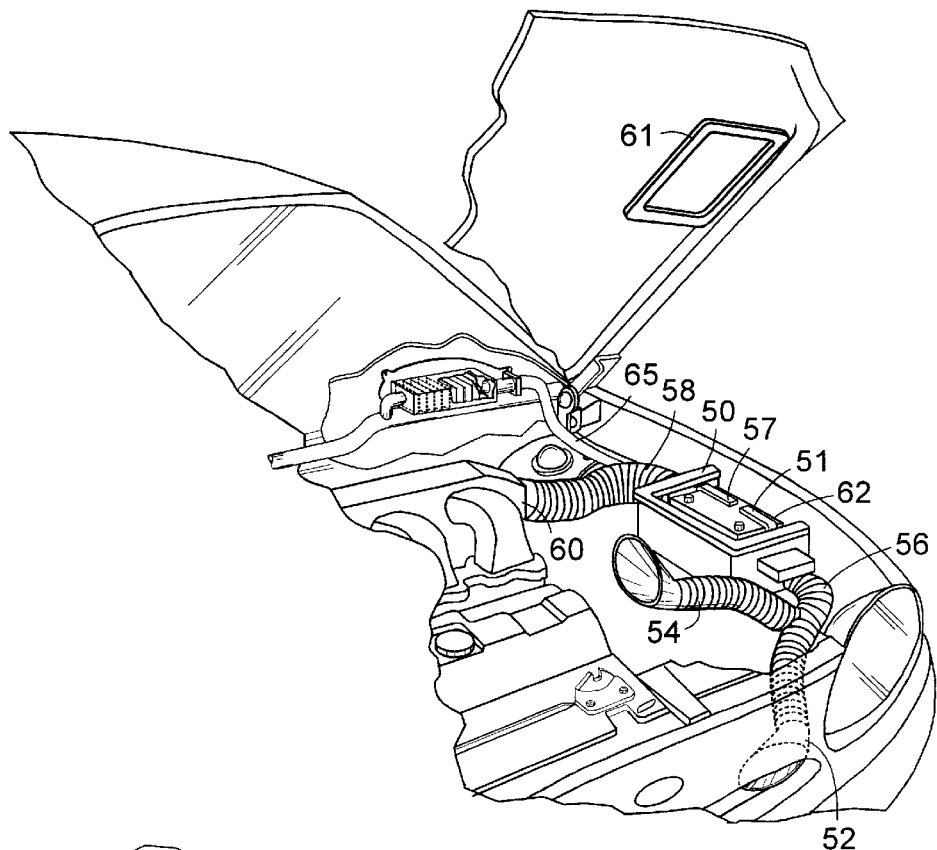
FIG. 5 is a view of an alternative embodiment.

In FIG. 5, an engine air intake system is integrated with a thermal chamber 50 for cooling a vehicle battery 51. The thermal chamber 50 receives ambient air from an ambient air intake duct 52, or heated air from a heated air intake duct 54, which receives air from an exhaust manifold of the engine. The ducts 52 and 54 are connected via a conventional joint 56, which contains disposed therein a damper (to be described in FIG. 6) which operates under thermostatic control to allow air from either duct 52 or duct 54 to enter thermal chamber 50. Air passing through thermal chamber 50 is filtered by a conventional filter 57 before exiting the thermal chamber and entering thermal chamber outlet duct 58, which transports the air into engine intake manifold designated generally at 60. Suction provided by the engine intake manifold 60 causes air to be drawn from ducts 52 or 54, through thermal chamber 50 and into thermal chamber outlet duct 58. The thermal chamber 50 is shown in FIG. 5 in an open position. When hood 59 is closed, a gasket 61 mounted on the interior surface of the hood forms a seal between a flange 62 on the thermal chamber and the hood, thereby enclosing the thermal chamber.

Inlet pipe 65 has a first end coupled to thermal chamber outlet duct 58 and a second end coupled to an opening in a portion of cross-car beam 15, as shown in greater detail in FIG. 2. Alternatively, the second end of the inlet pipe 65 may be coupled directly to the inlet opening of the card cage, as shown in greater detail in FIG. 3.

Figure 6:
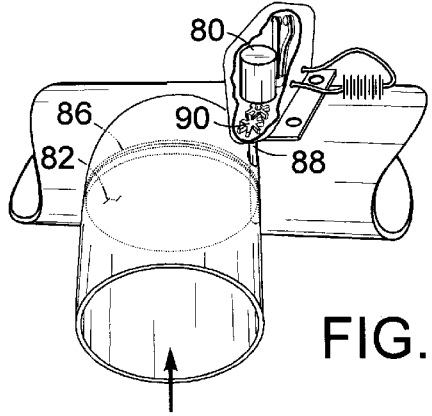
FIG. 6 is an enlarged, partial cutaway view of a portion of the embodiment of FIG. 5.

FIG. 6 of the drawings shows a partial cutaway view of the joint between intake duct 52 and intake pipe 54. The source of air to the thermal chamber 50 is controlled by damper 82 which swivels, under control of a motor 80, between a first position 83 in which air from intake duct 52 enters the thermal chamber 50, and a second position in which air from intake duct 54 enters the thermal chamber 50. The damper 82 includes a rubber seal 86 around the perimeter of the damper to reduce air flow around the edges of the damper. The damper is attached to a pivot pin 88 which has a gear 90 mounted thereon. The gear 90 is rotated by motor 80 to rotate the damper 82 from the first position 83 to the second position 84. The motor is conventional and operates under control of a signal from a thermostat which determines the position of the damper.

During engine operation, the air flow in thermal chamber outlet duct 58 caused by air sucked into the engine intake manifold 60 causes air to be sucked into inlet pipe 65, from where it travels through the card cage 16 and is expelled via the outlet pipe 66. During cold weather, when the temperature in the thermal chamber is below a predetermined point, heated air from the engine exhaust manifold is drawn through the thermal chamber and into the card cage to heat the electrical components contained therein. Once the temperature in the thermal chamber exceeds the predetermined point, the damper is moved under control of the thermostat to allow ambient air from ambient air duct 52 to enter the thermal chamber. As can be seen, an arrangement as shown in FIG. 5 advantageously cools both the vehicle battery and components contained in the card cage via an integrated mechanism which also provides air to the engine air intake. The card cage and the pipes leading into and out of the card cage are advantageously sealed to prevent air in the card cage from mixing with that in the passenger compartment.

It is to be understood that the specific mechanisms and techniques which have been described are merely illustrative of one application of the principles of the invention. Numerous modifications may be made to the methods and apparatus described without departing from the true spirit and scope of the invention.

What is claimed is:

1. Apparatus for cooling electrical components in a vehicle, comprising:

a card cage comprising a plurality of circuit boards coupled to a backplane and positioned inside an enclosed housing, said housing having an inlet opening and an outlet opening, the card cage being positioned between a firewall and an instrument panel of said vehicle;

an inlet pipe having a first end for receiving a forced air flow and a second end coupled to said inlet opening, the inlet pipe comprising a first inlet tube for receiving said forced air at a first end, and for expelling said forced air at a second end, a first portion of a structural hollow beam, said first portion being sealed at a first and second location to form an air transport pipe for transporting air from said first tube, and a second inlet tube having a first end coupled to said first portion of said structural hollow beam for receiving air from said structural hollow beam and a second end coupled to said inlet opening expelling air into said card cage;

an outlet pipe having a first end coupled to said outlet opening and a second end for expelling air from said card cage; and means for receiving air outside of a passenger compartment of said vehicle and for generating said forced air flow.

2. The invention as set forth in claim 1 wherein the outlet pipe comprises a first outlet tube for receiving air from said outlet opening, a second portion of said structural hollow beam, said second portion being sealed at a first and second location to form an air transport pipe for transporting air from said first outlet tube, and a second outlet tube having a first end coupled to said second portion of said structural hollow beam for receiving air from said structural hollow beam and a second end for expelling air from said structural hollow beam.

3. The invention as set forth in claim 1 wherein the means for generating said forced air flow is a fan.

4. The invention as set forth in claim 1 further comprising an engine air intake pipe having a first end for receiving filtered air and a second end coupled to an intake manifold of the vehicle engine, said inlet pipe being coupled at said first end to said engine air intake pipe.

5. Apparatus for cooling electrical components in a vehicle, comprising:

a card cage comprising a plurality of circuit boards coupled to a backplane and positioned inside an enclosed housing, said housing having an inlet opening and an outlet opening, the card cage being positioned between a firewall and an instrument panel of said vehicle;

an inlet pipe having a first end for receiving a forced air flow and a second end coupled to said inlet opening;

an outlet pipe having a first end coupled to said outlet opening and a second end for expelling air from said card cage, the outlet pipe comprising a first outlet tube for receiving air from said outlet opening, a second portion of a structural hollow beam, said second portion being sealed at a first and second location to form an air transport pipe for transporting air from said first outlet tube, and a second outlet tube having a first end coupled to said second portion of said structural hollow beam for receiving air from said structural hollow beam and a second end for expelling air from said structural hollow beam; and means for receiving air outside of a passenger compartment of said vehicle and for generating said forced air flow.

6. The invention as set forth in claim 5 wherein the inlet pipe comprises a single tube.

7. Apparatus for cooling electrical components in a vehicle, comprising:

a card cage comprising a plurality of circuit boards coupled to a backplane and positioned inside an enclosed housing, said housing having an inlet opening and an outlet opening, the card cage being positioned between a firewall and an instrument panel of said vehicle;

an inlet pipe having a first end for receiving a forced air flow and a second end coupled to said inlet opening, the inlet pipe comprising a first inlet tube for receiving said forced air at a first end, and for expelling said forced air at a second end, a first portion of a structural hollow beam, said first portion being sealed at a first and second location to form an air transport pipe for transporting air from said first tube, and a second inlet tube having a first end coupled to said first portion of said structural hollow beam for receiving air from said structural hollow beam and a second end coupled to said inlet opening expelling air into said card cage;

an outlet pipe having a first end coupled to said outlet opening and a second end for expelling air from said card cage; and means for receiving air outside of a passenger compartment of said vehicle and for generating said forced air flow comprising, a first air duct for transporting ambient air;

a second air duct for transporting heated air from an exhaust manifold of a vehicle engine;

an enclosed chamber containing a battery, an inlet opening and an outlet opening;

a third air duct for coupling said first air duct and said second air duct and containing a damper disposed within the third air duct for directing the flow of air from said first air duct or said second air duct into said third air duct, said third air duct coupled to said inlet opening of said enclosed chamber for expelling air into said inlet opening of said enclosed chamber;

a filter disposed in said enclosed chamber for filtering air expelled from said enclosed chamber;

a fourth air duct coupled at a first end to said outlet opening of said enclosed chamber and at a second end to an intake manifold of the vehicle engine; and a fifth air duct coupled at a first end to said fourth air duct and at a second end to said inlet pipe.

* * * * *